United States Patent [19]

Itoh et al.

[11] Patent Number: 4,908,931
[45] Date of Patent: Mar. 20, 1990

[54] APPARATUS FOR CUTTING A LEAD

[75] Inventors: Tomiteru Itoh; Shinsui Moroi, both of Katsuta; Munenobu Suzuki, Mito; Zenshiro Oyama, Katsuta; Yuji Sekimura, Katsuta; Mitho Haginoya, Ibaraki, all of Japan

[73] Assignee: Hitachi, Ltd., Tokyo, Japan

[21] Appl. No.: 179,989

[22] Filed: Apr. 11, 1988

[30] Foreign Application Priority Data

Apr. 10, 1987 [JP]  Japan .................................. 62-86880

[51] Int. Cl.$^4$ ............................................. H05K 13/04
[52] U.S. Cl. ..................................... 29/566.3; 29/705; 29/741; 29/838; 29/593; 83/62.1; 83/522.11; 83/360
[58] Field of Search ............ 83/360, 522, 62.1, 925 R; 29/566.3, 593, 705, 741, 838, 738

[56]  References Cited

U.S. PATENT DOCUMENTS

| | | | |
|---|---|---|---|
| 4,292,727 | 10/1981 | Mayner | 29/566.3 |
| 4,485,548 | 12/1984 | Janisiewicz | 29/566.3 |
| 4,570,336 | 2/1986 | Richter et al. | 29/566.3 X |
| 4,574,462 | 3/1986 | Jackson | 29/566.3 |
| 4,622,740 | 11/1986 | Mirley et al. | 29/741 X |

Primary Examiner—Donald R. Schran
Attorney, Agent, or Firm—Antonelli, Terry & Wands

[57]  ABSTRACT

An apparatus for cutting the leads of an electronic part inserted into a printed board and simultaneously detecting the insertion of said leads and/or the characteristics of said electronic part, said apparatus comprising:
  a first blade means having an electrically conductive surface;
  a second cutting blade means positioned in a cooperating relation to the first cutting blade means so as to cut the lead, said blade means having a substrate made of an electrically non-conductive material, a blade edge provided at one end of the substrate, and at least one wear-resisting electrode coating secured to the substrate in the vicinity of the blade edge so that the electrode coating is electrically in communication with the first cutting blade means through the lead only at the time of the cutting of the lead, said coating being made of a metal having wear resistance or an electrically conductive ceramic; and
  means for electrically connecting said electrode coating to said first blade member and for detecting the insertion of said lead and/or the characteristics of said electronic part.

11 Claims, 4 Drawing Sheets

APPARATUS FOR CUTTING A LEAD

BACKGROUND OF THE INVENTION

The present invention relates to the cutting of leads and particulary to an apparatus for cutting leads which has a pair of cutting blades in one of which are formed electrode coatings with excellent wear resistance and bonding strength, the apparatus being capable of checking the insertion of a lead and measuring the characteristics of an electronic part such as the polarities and constants thereof simultaneously with the cutting of the lead.

A conventional apparatus for cutting leads, which cuts off an excessive portion of a lead of an electronic part inserted into a printed board, uses a photo sensor system or an electric conduction system for examining whether or not the lead has been correctly inserted into the printed board, as described in, for example, Japanese Patent Laid-Open Publication No. 22397/1986. Such a method is performed in a process quite independent of the cutting process. The photo sensor system examines whether or not the lead has been correctly inserted into the printed board by the presence of a light transmission. Since this insertion check cannot be actually performed simultaneously with the cutting, the cutting must be conducted in a process independent thereof. The electric conduction system checks whether or not the lead has been inserted by utilizing electrical conduction, but it cannot check the insertion simultaneously with the cutting because cutting blades are made of metal electrically conductive. Since such conventional method performs the insertion check in a process that is independent of the cutting process, the overall process becomes complicated and is thus disadvantageous with respect to the cost and requirements for mass-production of electronic parts. On the other hand, conventional apparatus for cutting leads does not take into account any measurment of characteristics of electronic parts such as polarities and constants.

The above-described prior art involves problems in that no consideration is given to the simultaneous achieving of both the cutting of a lead, and checking of the insertion of the lead and/or the measuring of characteristics of an electronic parts through one step. In the prior art, these processes are performed independently.

SUMMARY OF THE INVENTION

It is an object of the present invention to provide an apparatus for cutting leads and a method of producing this apparatus in which at least one electrode coating with excellent wear resistance and superior bonding strength is formed on one of a pair of lead-cutting blades which one has a substrate of a non-conductive material, the number of the electrode coating being equivalent to the number of leads in a multipolar lead electronic part, the apparatus being capable of simultaneously cutting the lead and checking the insertion of the leads and/or measuring the characteristics of the part such as the polarities and constants thereof by use of both a blade provided with the electrode coatings and another electrically conductive blade cooperated with the former blade.

An apparatus of the present invention for cutting at least one lead of an electronic part inserted into a printed board and, at the same time, detecting the insertion of the lead and/or detecting the characteristics of the electronic part, comprising:

a first cutting blade means having an electrically conductive surface;

a second cutting blade means positioned in a cooperating relation to the first cutting blade means so as to cut the lead, said second blade means having a substrate made of an electrically non-conductive material, a blade edge provided at one end of the substrate, and at least one wear-resisting electrode coating bonded to the substrate in the vicinity of the blade edge so that the electrode coating is electrically in communication with the first cutting blade means through the lead only at the time of the cutting of the lead, said coating being made of a metal having wear resistance or an electrically conductive ceramic; and means for electrically connecting the electrode coating and the first cutting blade member and detecting the insertion of each of the leads and/or measuring the characteristics of an electronic part.

A method of producing the apparatus of the present invention which cuts the lead of an electronic part inserted into a printed board and, at the same time, detects the insertion of each of the leads and/or measures the characteristics of the electronic part, comprising the steps of:

providing a first substrate having an electrically conductive surface and a second substrate made of a non-conductive material and provided with a blade edge at one end thereof which edge cuts off an excess portion of the lead in cooperation with the first substrate; and providing at least one conductive electrode coating bonded onto the second substrate at a position corresponding to the positions of the lead in a usually insulated relation to the first substrate;

the electrode coating being formed by vapor deposition with injection of ions of a metal in Group IV$a$, V$a$, or VI$a$ of the Periodic Table or sputtering with the injection thereof;

To secure or bond electrode coatings onto the nonconductive material of the second substrate it was proposed to use a vapor deposition method, a printing method, a sputtering method and a plating method. However, all of these conventional methods produce coatings which exhibit poor bonding to the nonconductive material, with the result that the resultant coating peeled off during use and thus has insufficient durability. As a result of various investigations performed by the inventors with respect to a suitable method of securing or bonding electrode coatings, it was found that coatings with excellent adhesion can be formed by the method described below, and, when the coatings in accordance with the invention are used in an apparatus for cutting leads, optimum results can be obtained.

In the present invention, the formation of coatings on the substrate of one lead-cutting blade which substrate is made of an electrically non-conductive material is effected by a vapor deposition method or sputtering method performed together with the injection of ions, or alternately therewith, thereby forming conductive electrode coatings with good bonding strength, which allows the detection of lead insertion and/or measuring characteristics such as the polarity and constants thereof to be performed simultaneously with the cutting of the lead. Thus, the number of steps can be greatly reduced. In addition, when any abnormality is detected, the apparatus for cutting leads is stopped so that the production of defective parts can be kept to a minimum level.

The apparatus for cutting leads of the present invention comprises the two lead-cutting blades, one of which has a substrate made of a non-conductive material and electrode coatings bonded onto the electrically non-conductive substrate in a spaced apart relation with each other at interval defined by adjacent two leads to be cut. Between the non-conductive substrate and each of the electrode coatings there is formed an intermediate layer of a mixture of the components of the non-conductive substrate and the components of electrode coating. Thus, there is no clear boundary between the non-conductive substrate and each of the electrode coatings, with good bonding resulting. In other words, since the non-conductive material is sputtered at the time when the accelerated ions are penetrated into the non-conductive substrate, some component particles of the non-conductive material are ejected outward. The particles ejected from the non-conductive material are mixed with the particles of the coatings formed by the vapor deposition or sputtering method to form the intermediate layer on the surface of the non-conductive material in a mixed state. However, the thickness of the mixed layer is limited to a certain value, and when the mixture layer are thick, the accelerated ions can not be penetrated into a portion of the non-conductive material, and the components of this portion gradually vary into the coating components alone from the components of the non-conductive material. On the other hand, with respect to the electrode coatings formed on the non-conductive substrate of one cutting blade, since the accelerated ions collide with and stop at the non-conductive material, the kinetic energy of the accelerated ions is changed into heat energy which will generated intensive heat. When the accelerated ions is reactive ion, the intensive heat makes a compound be formed from both the reactive ion and the particles of the coatings which are formed by vapor deposition or sputtering. For example, if the coating particle is Ti and the reactive ion is N, TiN or $Ti_2N$ is formed, corresponding to the ratio between the N ion and the coating particle. On the other hand, if the ions used are non-reactive and the coating particle is Mo, no reaction takes place, with Mo coatings being produced. However, although no compound-forming reaction takes place, intensive heat is also generated in this case. Therefore, the Mo coating is formed at a high temperature, and the strength of the bonding of the coating is thus very much greater than that of the coating formed by an ordinary vapor deposition method. Since high temperature portion are limited only to the surface layer thereof alone, the non-conductive material is maintained as a whole at a low temperature. If a property of the substrate is apt to be changed or if substrate is apt to be deformed by heat accumulation, the heat accumulation in the non-conductive material can be prevented, as occasion demands, by cooling the non-conductive material or by intermittently injecting ions and intermittently forming the coating. A desirable method of forming electrode coatings is a method in which the formation of the coatings and the injection of ions are performed simultaneously. But, even if formation of the coatings and the injection of ion are performed alternately, similar electrode coatings can in fact be obtained, however, the thickness of the coatings to be formed and the acceleration voltage applied to the ions must be taken into consideration.

A suitable non-conductive material which may be used in one of the cutting blades is a material comprising ceramics as a main component. Since the cutting blade functions to cut off an excess portion of a lead, it is required to have both a wear-resisting property and a high degree of toughness in order to prevent breakage of the blade occurring at the time of cutting. Therefore, among various types of ceramics, zirconia is particularly useful as the component of one of the blades.

On the other hand, the electrode coatings formed on one of the cutting blades preferably must have excellent wear resistance and electric conductivity because they are repeatedly brought into contact with leads when cutting is effected. The metals in Group V$ia$ of the Periodic Table are preferably used as metal coatings, and conductive compounds selected from nitrides and carbides of the elements in Group IV$a$, V$a$ and VI$a$ of the Periodic Table are preferably used as compound coatings. Both the above-described metal and compound have excellent wear resistance sufficient to resist both contacts with the leads and the cutting thereof, and are thus preferable as the electrode coating. The bonding strength of the coating is preferably 2 kgf/mm$^2$ or more, more preferably 3 kgf/mm$^2$ or more. If the bonding strength is below 2 kgf/mm$^2$, the coatings in some cases become peeled off from the blade due to both their repeated contacts with the leads and cutting of the same, and are thus unsatisfactory with respect to the need for durability.

In the method of forming the electrode coatings, N ions are injected when a nitride is formed while forming the electrode coatings by vapor deposition or sputtering of a metal in Group IV$a$, V$a$ or V$ia$ of the Periodic Table, or while C ions are injected when a carbide is formed. When N ions are injected, a nitrogen gas or a gas such as an ammonia gas containing N may be used, and, when C ions are injected, a $C_2H_2$ or $CH_4$ gas containing C may be used. The gases that may be used in the present invention are not limited to these gases, and any gases which can form nitrides and carbides may be used. On the other hand, when the electrode coatings are metal coatings of a metal in Group VI$a$, a gas which does not form any compound by reacting with the coating-forming metals in Group VI$a$, that is, inert gas such as an He, Ar or Ne gas, is preferably used. However, the gases that may be used in the present invention are not limited to these gases, and any gases which do not form a compound by reacting with the metals in Group VI$a$ may be used.

In order for the electrode coating to meet the role of multipolar electrodes, it is necessary to provide insulating layer between each pair of two adjacent electrodes. A method of forming this insulating layer comprises the steps of: providing a masking on a substrate of a non-conductive material at portions, in which the electrode coating is unnecessary, at the same interval as that of the multiple electrodes; and applying the electrode coating on the substrate portions, whereby insulating portions can be suitably formed at the masked portions. Alternatively, a coating may be provided over the entire surface of the substrate of an electrically non-conductive material, and unnecessary portions of the coating can be then removed by mechanical processing or irradiation of ions so that other portions of the coating may remain at the same interval as that of the multiple electrodes. When the insulating portions are provided by irradiation of ions, the electrode coating portions which remain as electrode coating are masked so that the insulating portions alone can be formed. On the other hand, the coating may be formed only on the surface in the vicinity of the edge of the cutting blade by use of the above-described method, and a remaining portion other than the coating portion provided in the vicinity of the edge which remaining portion only receives and sends electrical signals may be coated by another conventional method such as vapor deposition. In other words, only at the electrode coating portion close to the edge of the cutting blade there are required both superior wear resistance and superior bonding strength, while regarding the remaining portion other than this it is merely required that the coatings are not peeled off from the substrate when being used.

Both the electrode coating formed by the above-described method and the electrically conductive cutting blade may be wired so as to be able to send and receive electrical signals, and are connected to detectors.

DETAILED DESCRIPTION OF THE PREFERRED EMBODIMENTS

Figure 1:
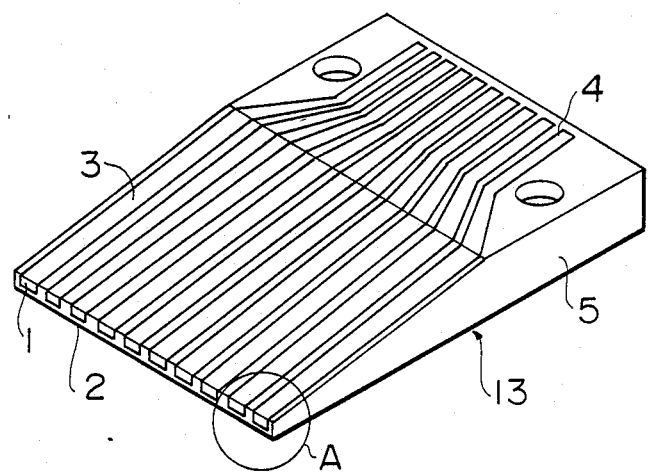
FIG. 1 is a perspective view of a structure of one of cutting blades of an embodiment of the present invention which one is provided with electrodes (1, 3) for detecting the insertion of the leads of an electronic part.
Figure 4A:
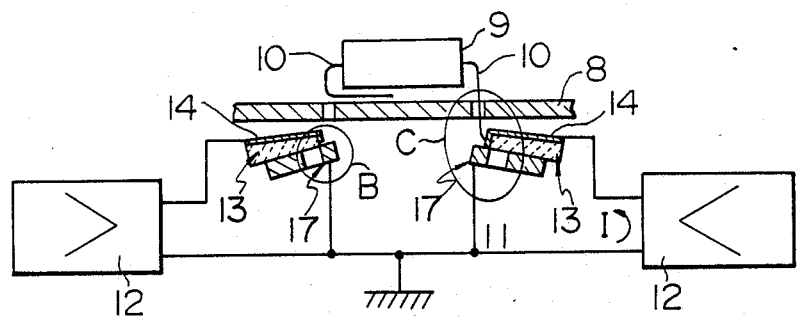
FIG. 4A is a diagrammatic view showing principle of the operations of both cutting and checking the insertion of leads of an electronic part in which the leads of the electronic part IC inserted into a printed board are cut and checked by a pair of cutting blades (13, 17)
Figure 4B:
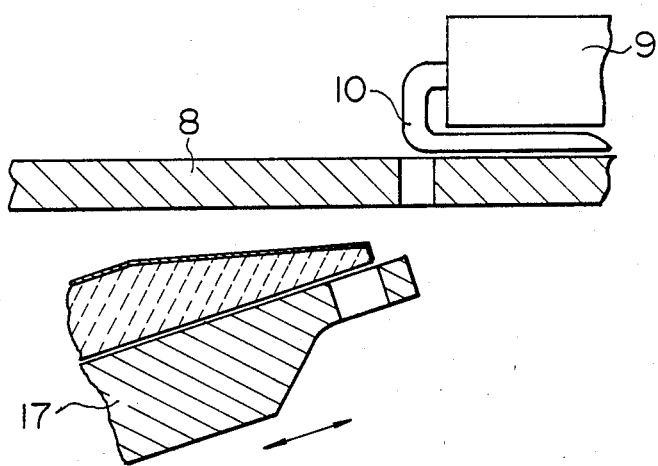
FIG. 4B is an enlarged sectional view of a portion B of FIG. 4A.

FIG. 1 shows a structure of one cutting blade member 13 provided with electrodes 1 for detecting the insertion of leads and for simultaneously cutting the excess portion of each of the leads of an electronic part inserted by an automatic IC-inserting machine. Regarding a pair of blade members, the cutting blade member 13 having a substrate 5 made of a non-conductive material such as ceramics is provided with a blade edge 2 at its one end, the blade edge 2 being disposed in a slidable contact relation on the surface of the other cutting blade member 17 (FIGS. 4A and 4B). The end of the cutting blade member 13 with the blade edge 2 is provided with electrode coatings disposed at positions corresponding to the leads to be inserted into a printed board. These electrode coatings extend from the end provided with the blade edge 2 toward the other end along the axis of the substrate 5 on the surface thereof. One end of each of the electrode coatings 1 is spaced apart from the edge 2 about 0.5 mm at most and is thus kept electrically insulated from the other cutting blade member 17.

However, even if the ends of the electrode coatings 1 are flush with the blade edge 2, it is possible to make the coating 1 be insulated regarding the other cutting blade having an electrically conductive surface by providing a lubricating film or oxide film on the end face of the electrode coating 1 which end face is flush with the edge 2.

Figure 4C:
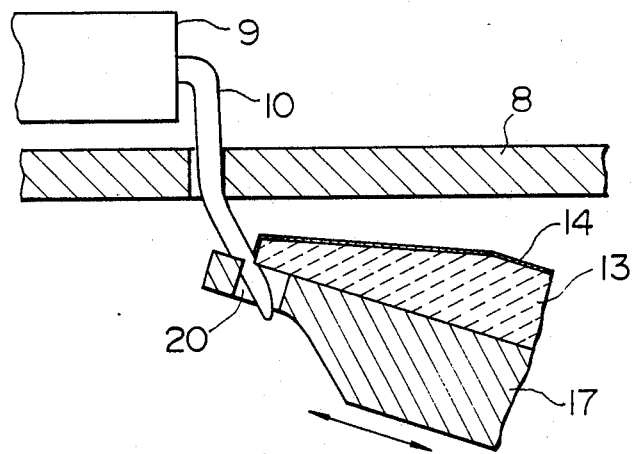
FIG. 4C is an enlarged sectional vie of a portion C of FIG. 4A.

The cutting blade member 17 is made of a metal, conductive ceramic, or a material comprising an insulator substrate and an electrically conductive surface provided on the substrate, and has a through hole 20 into which there is inserted an excess portion of a lead of an electronic part inserted into a printed board 8, which hole 20 has a diameter of 1 to 1.5 mm and a height of 1 to 2 mm, as shown in FIGS. 4A and 4C. When the first cutting blade member 17 is made to slide so that the blade edge 2 of the second cutting blade 13 closes the through hole 20, the lead is cut when a lead is inserted into the hole 20, and at the same time a conductive state also occurs between each of electrode coatings 14 and the first cutting blade member 17 when the lead is cut as shown in FIG. 4C. If no lead is inserted into the hole 20, a conductive state does not occur between the electrode coating 14 and the first cutting blade member 17.

The electrode coatings 14, insulated each other, are formed at the edge of the cutting blade member in a number equivalent to the number of leads of an IC by vapor deposition or sputtering which is accompanied by injection of ions.

Figure 2:
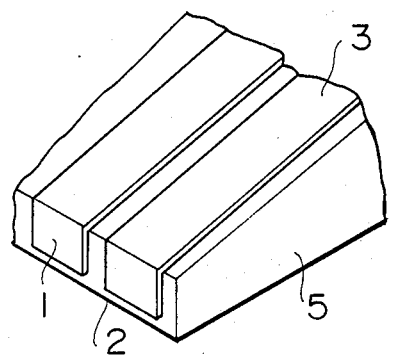
FIG. 2 is a perspective view of a portion A enlarged at the edge (2) of the cutting blade of FIG. 1.
Figure 3:
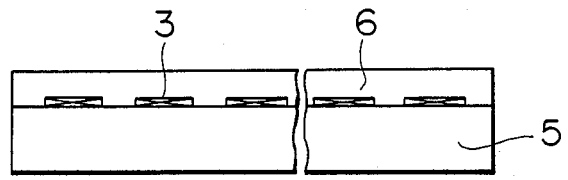
FIG. 3 is a front view of an example in which an electrode portion 3 other than another electrode portion provided in the vicinity of the edge 2 shown in FIG. 1 is coated with an insulator in order to prevent damage and short-circuiting of the conductor.

In FIG. 1 the substrate 5 made of a non-conductive material has both an electrode or conductor portions 3 each integral with the electrode coating 1 and connection terminals 4 in order to allow wiring from the electrode coatings 1 at the edge of the cutting blade to a lead detection circuit. In mechanism for detecting the insertion of an IC lead simultaneously with the cutting of the IC lead, there are used two pairs of cutting blades (13 and 17) at the right and left sides of the IC (9) one of which blade is provided with the electrodes for detecting leads, as shown in FIG. 4A. FIG. 2 is an enlarged drawing of a portion A of the cutting blade. As shown in FIG. 3, it is preferable to cover the conductor portions 3 by an insulator such as ceramics while making the electrode coatings 1 be exposed without covering which coating 1 is provided at the end of the blade edge 2.

This covering prevents any short circuiting and damage of the conductors by flying pieces 11 cut from IC leads.

FIG. 4A shows the principle of the operation of detecting the insertion of a lead simultaneously with the cutting of an excess portion of the lead inserted in a printed board by an automatic IC-inserting machine, wherein one of the cutting blades used is provided with electrodes for detecting the insertion of leads as shown in FIG. 1, which electrodes are insulated each other and are formed in an end of the substrate which end includes the blade edge thereof, by use of the above-described method. A description will now be made of the operation of detecting the insertion of the leads of an electronic part.

FIG. 4C shows a case in which a lead 10 of an IC 9 is properly inserted into a printed board 8, and FIG. 4B shows a case in which the lead 10 is bent and is not inserted properly into the printed board 8. When the IC lead 10 is properly inserted into the printed board 8, an excess portion of the IC lead 10 enters the through hole 20 of the conductive blade 17, and is cut in the cutting process by a first cutting blade 17 having a conductive surface and a second cutting blade 13 both in sliding contact with each other to close the through hole. At the time of this cutting, both the conductor coating 14 and the electrically conductor blade 17 become electrically connected through the IC lead 10 so that a current I passes through a lead detection circuit 12, thus enabling a decision concerning whether or not the IC lead 10 is properly inserted into the printed board 8. On the other hand, when the IC lead 10 is bent and is not inserted properly into the printed board 8 as shown in FIG. 4B, the conductor coating 14 and the conductor blade 17 are spaced to provide an open circuit and no current passes through the lead detection circuit 12, thus it becomes possible to detect that the IC lead 10 is not inserted into the printed board 8 because it was bent. In this way, when it is detected by the detection system that no lead has been inserted, there is indicated the position of the bent lead by electrical signal from the lead detection circuit 12 and simultaneously the operation of cutting the IC lead is made to stop. According to the lead-cutting apparatus of the present invention it is possible to effect detection as to whether a lead is inserted or not in a short period of time and simultaneously to effect the cutting of the lead, which apparatus has a very simple structure and causes substantially no error in the detection process.

In addition, this apparatus is capable of both determining the polarities of polar electronic parts and measuring the constants of resistors and capacitors during the cutting of the leads of an electronic part by use of the cutting blades electrically connected to each other through the lead. Further, the apparatus has a simple structure enabling its application to be expanded.

Working examples of the present invention are described in detail below.

Working Example 1

A rectangular parallelepipedon made of zirconia having dimensions of 50 mm × 40 mm × 7 mm was used to produce a cutting blade member onto which electrode coating is to be formed. The thus-formed cutting blade member had a substrate 5 having an axial length of 48 mm, one end thereof being 0.3 mm in height and 38 mm in width and the other end thereof being 6 mm in height and 38 mm in width.

The cutting blade member was attached to a water-cooling target cooled with water, and air in a vessel receiving the blade member was evacuated to $10^{-6}$ torr or less. A TiN coating of about 3 $\mu$m thick was formed on the substrate of the blade member by effecting vapor deposition of Ti while injecting N ions. The formation of the coating was effected in such conditions that the rate of deposition was 8 Å/s, the acceleration voltage was 20 kV, and the amount of nitrogen ions injected was $6 \times 10^{17}/cm^2/min$. In this example, there were formed two types of coatings, that is, one type in which masking was previously applied to form the electrode coatings shown in FIG. 1 and the other type in which a coating was formed on both the end face of a blade edge and the entire upper surface of the cutting blade. By use of the same method and under the same conditions, a TiC coating was formed by effecting vapor deposition of Ti while injecting C ions, and a Mo coating was formed by effecting vapor deposition of Mo while injecting He ions. In addition, a coating was also formed on each of zirconia plates (10 mm × 30 mm × 2 mm) by the same method and under the same conditions as above to form an analytical specimen and test pieces for examining bonding strength.

Figure 5:
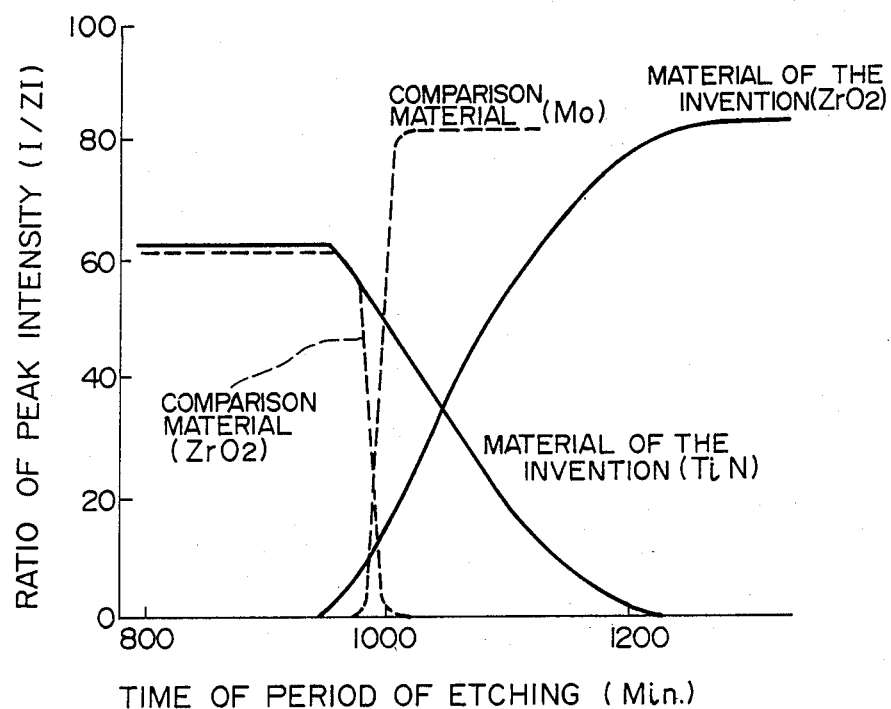
FIG. 5 is a graph showing the results of analysis of the coatings by Auger electron spectroscope.

FIG. 5 shows a typical example of the results obtained by the analyses of both the TiN coating formed by the method of the present invention and the Mo coating formed by a conventional vapor deposition method, which analyses was effected in a direction of depth from their surfaces by Auger electron spectroscope. As can be seen from FIG. 5, in the specimen having the coating formed by the method of the present invention, the concentration of TiN gradually decreased from the surface thereof to the substrate side, and the concentration of $ZrO_2$ gradually increased. While in the specimen having the coating formed by the conventional vapor deposition method alone, the concentrations of Mo and $ZrO_2$ both rapidly varied. In other words, it was found that, in the specimen having the coating formed by the method of the present invention, a mixed layer comprising both the coating components and the substrate components was formed between the TiN coating and the substrate. Although it was appeared that a mixed layer was also formed to some extent in the comparison specimen having the Mo coating, this was due to the influence of the roughness of the surface of the substrate made of $ZrO_2$. Even if this influence was taken into account, it was apparent that the mixed layer was formed in the specimen of the present invention.

Table 1 shows the results of tests of bonding strengths of the coatings.

TABLE 1

|  | Kind of coating | Bonding Strength (kgf/mm$^2$) |
| --- | --- | --- |
| Test pieces of the invention | TiN | >7.8 |
|  | Mo | >7.2 |
|  | TiC | >7.5 |
| Comparison test pieces | Mo (evaporation) | 0.05 |
|  | W (printing) | 0.03 |
|  | Cr (sputtering) | 0.50 |

The tests of the bonding strengths of the coatings were performed by using a tensile machine and an epoxy resin-based adhesive for bonding the coatings to a jig. As can be seen from Table 1, all of the test pieces of the present invention were broken and separated from bonding portions, showing the bonding strength of 7 kgf/mm$^2$ or more, and all test pieces formed by the conventional evaporation method, printing method and sputtering method showed low values of bonding strength. It is deemed that the test pieces of the present invention showed high values of bonding strength because they each had the above-described mixed layer. The TiC and Mo coatings also showed the same results as that obtained by the TiN coating.

Table 2 shows the results of tests of cutting durability which were performed by using the lead cutting blades actually incorporated in a cutting machine.

TABLE 2

|  | Kind of coating | Number of cutting (times) |
| --- | --- | --- |
| Test pieces of the invention | TiN | 2,500,000 |
|  | Mo | 2,000,000 |
|  | TiC | 2,600,000 |
| Comparison test pieces | Mo (evaporation) | 50 |
|  | W (printing) | 30 |
|  | Cr (sputtering) | 1,500 |

As can be seen from Table 2, the numbers of times for cutting in a case of using the blades on one of which the TiN coating, Mo coating and TiC coating were respectively formed by the method of the present invention were 2500000 times, 2000000 times and 2600000 times, respectively. The service lives of these cutting blades were determined by wear and no peeling off of the coating occurred in the tests. On the other hand, the comparison cutting blades having the Mo coating, the W coating and the Cr coating which were formed by a conventional evaporation method, printing method, and sputtering method, respectively, show extremely short service life due to the peeling off of the coating from the substrate.

As described above, it is apparent that the coatings formed by the method of the present invention produce extremely good results when being used in a lead cutting machine.

Working Example 2

A mechanism for effecting both the cutting of IC leads and the detecting of the insertion of IC lead with respect to 20 pins with a width of 300 mills and another mechanism with respect to 40 pins with a width of 600 mills were combined to produce the apparatus of the invention by using both a cutting blade member having a blade structure which was provided with the lead-detecting electrode coatings shown in FIG. 1 and another cutting blade having through holes into which the excess portion of each head received.

A direct current was applied to an IC lead from each of the IC lead detection circuits 12 shown in FIG. 4A in order to detect the insertion of the lead at the time of the cutting of the IC lead, so that the insertion of the IC lead 10 was detected by the presence of the current I passing through the lead 10. During the detection, the voltage applied to the IC lead was set at a value of $\frac{1}{4}$ of the breakdown voltage of the IC element so as to prevent the breakage of the IC element by the applied voltage for detecting the lead.

Working Example 3

Figure 6A:
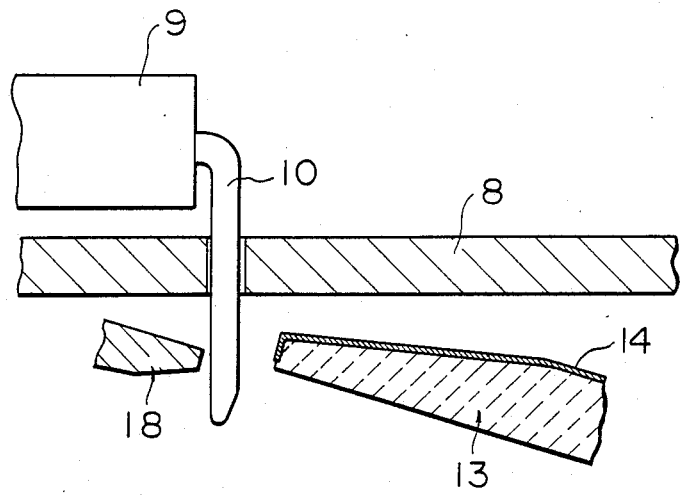
FIGS. 6A and 6B are sectional views of main portions of lead-cutting and lead-insertion-detecting apparatus of another embodiment of the present invention.
Figure 6B:
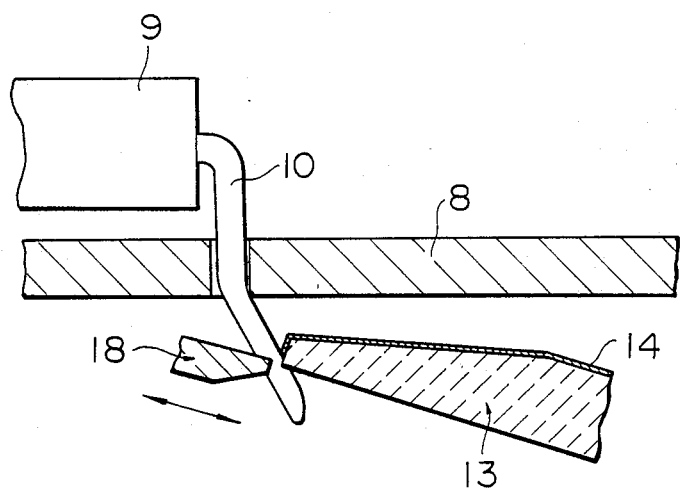

An apparatus for cutting leads and detecting the insertion thereof was produced by using the same members as those used in Working Example 2 with the exception that the cutting blade member 18 (shown in FIG. 6A) having a conductive surface is provided with no through hole. At an initial position the cutting blade member 18 were spaced apart from the first cutting blade member 13 so as to provide a space for receiving an excessive portion of a lead. Therefore, during operation, the lead properly inserted into a printed board passed the space defined by both the end of the cutting blade member 18 and the end of cutting blade member 13 provided with an electrode coating, and then an excess portion of the lead was cut by the cooperation of both the blade member 13 and the blade member 18 which slid toward the cutting blade member 13 while being in contact therewith.

The above-described working examples are representative examples of the present invention, and the present invention is not limited to these working examples.

The apparatus for cutting leads of the present invention is capable of simultaneously cutting a lead and detecting the insertion of the lead, and thus reducing the time required for cutting and detecting the lead of an electronic part. The errors occurring when the insertion of a lead is detected after an electronic part has been inserted into a printed board was also as very small as 0.5 times of that occurring by a conventional photo sensor system.

In addition, since the substrate of the lead cutting blade and the lead detecting electrodes provided thereon are integrally formed, the cutting mechanism is very simple. The apparatus of the present invention can be widely applied in the determination of the constants and polarities of electronic parts in addition to the cutting of the leads of electronic parts and the detection of the insertion thereof.

What is claimed is:

1. An apparatus for cutting the leads of an electronic part inserted into a printed board and simultaneously detecting the insertion of said leads and/or the characteristics of said electronic part, said apparatus comprising:
   a first cutting blade means having an electrically conductive surface;
   a second cutting blade means positioned in a cooperating relation to the first cutting blade means to cut a lead, said second cutting blade means comprising a substrate made of an electrically non-conductive material, a blade edge provided at one end of the substrate, and at least wearresisting electrode coating bonded to the substrate in the vicinity of the blade edge so that the electrode coating is electrically in communication with the first cutting blade means through the lead only at the time of cutting of the lead, said electrode coating being made of a metal having wear resistance or an electrically conductive ceramic and said electrode coating being bonded to said substrate through a mixed layer in which components of said non-conductive material and components of said electrode coating are mixed together without having any clear boundary between said non-conductive material and said electrode coating; and
   a means for electrically connecting said electrode coating to said first cutting blade means and for detecting the insertion of said lead and/or the characteristics of said electronic part.

2. An apparatus according to claim 1, wherein the bonding strength of said electrode coating bonded to said substrate is 2 kgf/cm$^2$ or more.

3. An apparatus according to claim 1, wherein said electrode coating is made of a metal in Group VI$a$ of the Periodic Table or an electrically conductive compound selected from nitrides and carbides of the elements in Group IV$a$, V$a$ and V$ia$ of the Periodic Table.

4. An apparatus according to claim 1, wherein said electrode coating is made of a material selected from the group consisting of TiN, Mo and TiC, the substrate of said second cutting blade means being made of zirconia and said first cutting blade means being made of a metal, a conductive ceramic, or a material comprising a conductive surface provided on an insulator.

5. An apparatus according to claim 1, wherein said electrode coating is covered with an insulator with the exception of a portion of said electrode coating which is provided at the end having said blade edge.

6. An apparatus according to claim 1, wherein said electrode coating is obtained by alternately or simultaneously effecting the formation of said coating through a vapor deposition or sputtering method and the injection of ions.

7. An apparatus according to claim 1, wherein said at least one wear-resisting electrode coating comprises a plurality of electrode coatings, each provided at an interval equivalent to that between said leads of said electronic part.

8. An apparatus according to claim 1, wherein said first cutting blade means comprises a blade member having a through hole for receiving each of said leads of said electronic part inserted into said printed board.

9. An apparatus according to claim 1, wherein said first cutting blade means comprises a blade member, one end of said blade member being positioned apart from said second cutting blade means so as to define a space for receiving said leads of said electronic part inserted into said printed board.

10. An apparatus for cutting leads of an electronic part inserted into a printed board and for simultaneously detecting an insertion of said leads and/or characteristics of said electronic part, said apparatus comprising:

a first cutting blade means having an electrically conductive surface;

a second cutting blade means positioned in a cooperating relation to the first cutting blade means to cut a lead, said second blade means comprising a substrate made of an electrically non-conductive material, a blade edge provided at one end of the substrate, and at least wear-resisting electrode coating bonded to the substrate in the vicinity of the blade edge so that the electrode coating is electrically in communication with the first cutting blade means through the lead only at the time of cutting of the lead, said electrode coating being made of a metal having a wear resistance or an electrically conductive ceramic, the first cutting blade means comprising a first blade member having a planar surface positioned in sliding contact with the blade edge provided on one end of the substrate of the second cutting blade means; and a means for electrically connecting said electrode coating to said first cutting blade means and for detecting the insertion of said lead and/or the characteristics of said electronic part.

11. An apparatus according to claim 10, wherein said electrode coating is bonded to said substrate to exhibit a bonding strength of at least 2 kgf/cm$^2$.

* * * * *